(12) United States Patent
Ji

(10) Patent No.: US 12,362,025 B2
(45) Date of Patent: Jul. 15, 2025

(54) ANTI-FUSE ADDRESS DECODING CIRCUIT, OPERATION METHOD, AND MEMORY

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 255 days.

(21) Appl. No.: 18/166,693

(22) Filed: Feb. 9, 2023

(65) Prior Publication Data

US 2023/0317188 A1 Oct. 5, 2023

Related U.S. Application Data

(63) Continuation of application No. PCT/CN2022/099560, filed on Jun. 17, 2022.

(30) Foreign Application Priority Data

Apr. 2, 2022 (CN) .......................... 202210350507.4

(51) Int. Cl.
| | | |
|---|---|---|
| *G11C 17/18* | (2006.01) | |
| *G11C 8/08* | (2006.01) | |
| *G11C 8/10* | (2006.01) | |
| *G11C 17/16* | (2006.01) | |
| *H10B 20/25* | (2023.01) | |
| *H01L 23/525* | (2006.01) | |

(52) U.S. Cl.
CPC ................ *G11C 17/18* (2013.01); *G11C 8/08* (2013.01); *G11C 8/10* (2013.01); *G11C 17/16* (2013.01); *H10B 20/25* (2023.02); *H01L 23/5252* (2013.01)

(58) Field of Classification Search
CPC .. G11C 17/18; G11C 8/08; G11C 8/10; G11C 17/16; H10B 20/25; H01L 23/5252
See application file for complete search history.

(56) References Cited

U.S. PATENT DOCUMENTS

| | | |
|---|---|---|
| 6,163,497 A | 12/2000 | Jung |
| 6,285,603 B1 | 9/2001 | Ku |
| 10,783,976 B2 | 9/2020 | Jo |
| 2006/0083099 A1* | 4/2006 | Bae ....................... G11C 29/844 |
| | | 365/230.06 |
| 2006/0152959 A1* | 7/2006 | Jung ...................... G11C 17/18 |
| | | 365/94 |

(Continued)

FOREIGN PATENT DOCUMENTS

CN 113870929 A 12/2021

*Primary Examiner* — Amir Zarabian
*Assistant Examiner* — Justin Bryce Heisterkamp
(74) *Attorney, Agent, or Firm* — SYNCODA LLC; Feng Ma

(57) ABSTRACT

An anti-fuse address decoding circuit includes: a pre-decoding circuit, configured to decode a programming address of an anti-fuse memory array and output a programming address pre-decoded signal; a level shift circuit, coupled to the pre-decoding circuit, and configured to boost the programming address pre-decoded signal and output a boosted signal; and a programming address decoding circuit, configured to receive the boosted signal, decode the boosted signal and output a programming address signal.

18 Claims, 9 Drawing Sheets

(56) References Cited

U.S. PATENT DOCUMENTS

| | | | |
|---|---|---|---|
| 2013/0223171 A1* | 8/2013 | Kim | G11C 29/789 |
| | | | 365/200 |
| 2013/0294140 A1* | 11/2013 | Oh | G11C 29/76 |
| | | | 365/96 |
| 2017/0062055 A1* | 3/2017 | Polizzi | G11C 16/32 |
| 2017/0263319 A1 | 9/2017 | Polizzi et al. | |
| 2020/0051653 A1* | 2/2020 | Kurjanowicz | H10B 20/65 |
| 2023/0197178 A1* | 6/2023 | Wang | G11C 17/18 |
| | | | 365/96 |

* cited by examiner

US 12,362,025 B2

ANTI-FUSE ADDRESS DECODING CIRCUIT, OPERATION METHOD, AND MEMORY

CROSS-REFERENCE TO RELATED APPLICATIONS

This is a continuation of International Application No. PCT/CN2022/099560 filed on Jun. 17, 2022, which is based upon and claims priority to Chinese Patent Application No. 202210350507.4, filed on Apr. 2, 2022 and entitled "ANTI-FUSE ADDRESS DECODING CIRCUIT, OPERATION METHOD, AND MEMORY", the contents of these applications are hereby incorporated by reference in their entireties.

BACKGROUND

Anti-fuse technology-based one-time programmable devices are widely applied to various types of chips. For example, in a dynamic random access memory (DRAM) chip, the anti-fuse programmable memory can be used to store address information of defective memory cells, so as to achieve redundant replacement (including row replacement and column replacement). The precise repair and adjustment of various parameters (for example, voltages, currents, and frequencies,) in the chip can also be achieved by programming the anti-fuse programmable memory. When the chip is powered on and started, information stored in the anti-fuse programmable memory is transmitted by means of a built-in transmission circuit and is latched at a place where the information is to be used.

However, the existing anti-fuse device has problems of being large in chip area and high in cost.

SUMMARY

The disclosure relates to the technical field of integrated circuits, in particular, to an anti-fuse address decoding circuit, an operation method, and a memory.

A first aspect of embodiments of the disclosure provides an anti-fuse address decoding circuit. The anti-fuse address decoding circuit includes a pre-decoding circuit, a level shift circuit and a programming address decoding circuit.

The pre-decoding circuit is configured to decode a programming address of an anti-fuse memory array and output a programming address pre-decoded signal. The level shift circuit is coupled to the pre-decoding circuit, and is configured to boost the programming address pre-decoded signal and output a boosted signal. The programming address decoding circuit is configured to receive the boosted signal, decode the boosted signal and output a programming address signal.

A second aspect of embodiments of the disclosure provides a memory. The memory includes an anti-fuse address decoding circuit. The anti-fuse address decoding circuit includes a pre-decoding circuit, a level shift circuit and a programming address decoding circuit. The pre-decoding circuit is configured to decode a programming address of an anti-fuse memory array and output a programming address pre-decoded signal. The level shift circuit is coupled to the pre-decoding circuit, and is configured to boost the programming address pre-decoded signal and output a boosted signal. The programming address decoding circuit is configured to receive the boosted signal, decode the boosted signal and output a programming address signal.

A third aspect of embodiments of the disclosure provides an operation method for an anti-fuse address decoding circuit. The operation method includes the following operations.

A pre-decoding circuit decodes an input programming address of an anti-fuse memory array and outputs a programming address pre-decoded signal. A level shift circuit boosts the programming address pre-decoded signal and outputs a boosted signal. A programming address decoding circuit decodes the boosted signal and outputs a programming address signal.

BRIEF DESCRIPTION OF THE DRAWINGS

In order to more clearly illustrate the technical solutions in the embodiments of the disclosure or conventional technologies, the drawings used in the embodiments will be briefly described below. It is apparent that the drawings in the following descriptions are merely some embodiments of the disclosure. Other drawings can be obtained from those skilled in the art according to these drawings without any creative work.

EXPLANATION OF REFERENCE SIGNS

Figure 1:
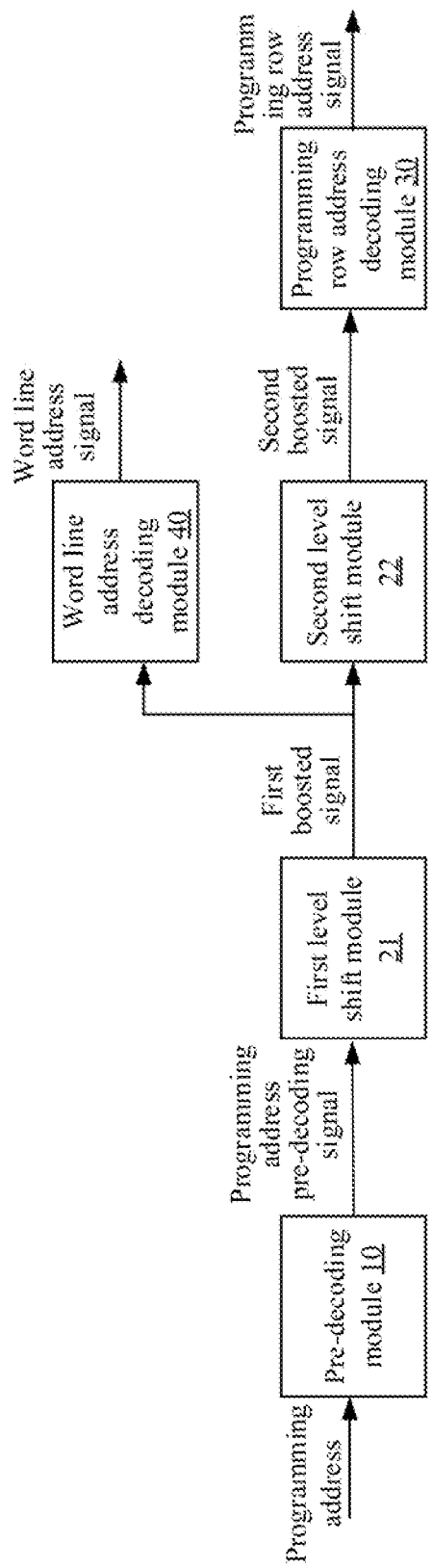
FIG. 1 illustrates a schematic structural diagram of an anti-fuse address decoding circuit according to embodiments of the disclosure.

10—Pre-decoding circuit;
21—First level shift circuit; 22—Second level shift circuit;
30—Programming row address decoding circuit; 31—Second NAND gate; 32—Second phase inverter; 311—Fourth P-type transistor; 312—Fifth P-type transistor; 313—Fourth N-type transistor; 314—Fifth N-type transistor; 321—Sixth P-type transistor; 322—Sixth N-type transistor;
40—Word-line address decoding circuit; 41—First NAND gate; 42—First phase inverter; 411—First P-type transistor; 412—Second P-type transistor;

413—First N-type transistor; 414—Second N-type transistor; 421—Third P-type transistor; 422—Third N-type transistor;

50—Anti-fuse memory cell; 501—First anti-fuse storage transistor; 502—First transistor; 503—Second transistor; 504—Second anti-fuse storage transistor.

DETAILED DESCRIPTION

Exemplary embodiments disclosed in the disclosure are described in more detail with reference to drawings. Although the exemplary embodiments of the disclosure are illustrated in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, not all the features of the actual embodiments are described here, and well-known functions and structures are not described in detail.

In the drawings, the sizes of layers, regions, and elements and their relative sizes may be exaggerated for clarity. The same reference sign represents the same element throughout.

It should be understood that while an element or layer is referred to as being "on", "adjacent to", "connected to" or "coupled to" another element or layer, it may be directly on, adjacent to, connected or coupled to the another element or layer, or an intermediate element or layer may exist. In contrast, while the element is referred to as being "directly on", "directly adjacent to", "directly connected to" or "directly coupled to" another element or layer, there is no intermediate element or layer. It should be understood that although terms "first", "second", "third" and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While a second element, component, region, layer or section is discussed, it does not mean that a first element, component, region, layer or section necessarily exist in the disclosure.

Spatial relation terms, such as "under", "below", "lower", "underneath", "above", "upper" and the like, may be used here for convenient description so that a relationship between one element or feature shown in the drawings and another element or feature is described. It should be understood that in addition to orientations shown in the drawings, the spatial relationship terms are intended to further include the different orientations of a device in use and operation. For example, if a device in the drawings is turned over, then an element or the feature described as "below" or "underneath" or "under" another element may be oriented "on" the another element or feature. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates otherwise. It should also be understood that usage of terms "composition" and/or "including" in the description determines the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below. However, the disclosure may also have other implementations in addition to these detailed descriptions.

In some embodiments, in an anti-fuse memory array, since there are multiple word line (WL) address signals and multiple programming row address signals, if no pre-decoding is performed, multiple level shift circuits are required to perform level shift on the WL address signals and the programming row address signals after decoding is performed. For example, if there are 256 WL address signals, a 16-to-256 decoder is required, and 256 level shift circuits are required to perform level shift on a 256-bit signal after decoding. As a result, there are too many level shift circuits, resulting in increased chip area and cost.

Based on this, embodiments of the disclosure provide an anti-fuse address decoding circuit. FIG. 1 illustrates a schematic structural diagram of an anti-fuse address decoding circuit according to embodiments of the disclosure.

Referring to FIG. 1, the anti-fuse address decoding circuit includes a pre-decoding circuit 10, a level shift circuit, and a programming address decoding circuit. The pre-decoding circuit 10 is configured to decode a programming address of an anti-fuse memory array and output a programming address pre-decoded signal. The level shift circuit is coupled to the pre-decoding circuit 10 and is configured to boost the programming address pre-decoded signal and output a boosted signal. The programming address decoding circuit is configured to receive the boosted signal, decode the boosted signal and output a programming address signal.

In the embodiments of the disclosure, by firstly pre-decoding the anti-fuse address decoding circuit, then boosting the pre-decoded signal by the level shift circuit and then performing decoding to obtain an address signal, the number of level shift circuits can be reduced, so that an area of a chip can be decreased, and cost can be reduced.

Figure 2:
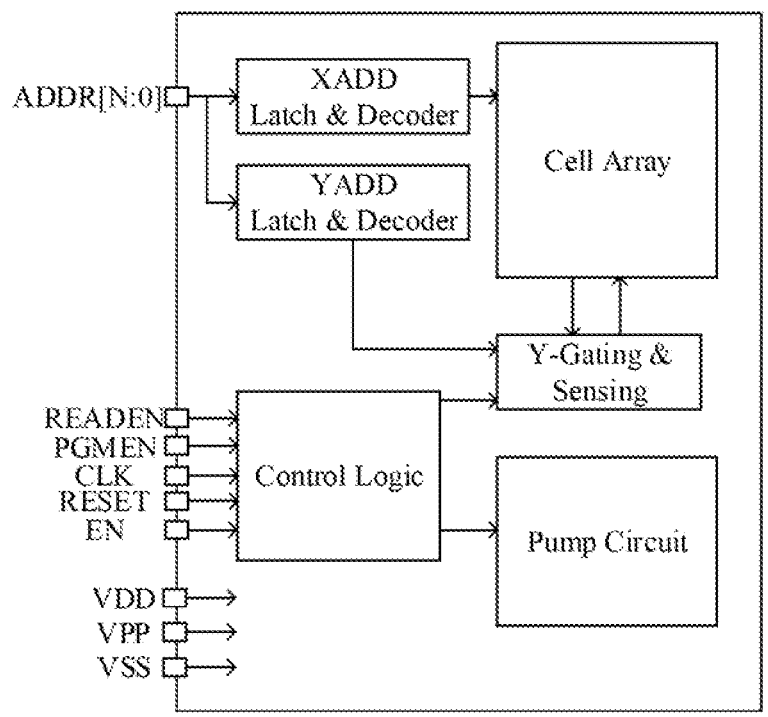
FIG. 2 illustrates a schematic structural diagram of an anti-fuse memory according to embodiments of the disclosure.

FIG. 2 illustrates a schematic structural diagram of an anti-fuse memory according to embodiments of the disclosure.

As illustrated in FIG. 2, the anti-fuse memory includes an anti-fuse memory array (Cell Array), a row address latching and decoding circuit (XADD Latch & Decoder), a column address latching and decoding circuit (YADD Latch & Decoder), a high voltage circuit (Pump Circuit), a gating and amplification circuit (Y-Gating & Sensing) and a logic control circuit (Control Logic).

Specifically, the row address latching and decoding circuit is configured to latch and decode row address information of the anti-fuse memory array. The column address latching and decoding circuit is configured to latch and decode column address information of the anti-fuse memory array.

The high voltage circuit is configured to produce a high voltage to program an anti-fuse memory cell in the anti-fuse memory array. For example, in an anti-fuse application, the high voltage is applied to a gate oxide layer of the anti-fuse memory cell, so as to achieve programming.

The gating and amplification circuit is configured to detect and determine information stored in the anti-fuse memory cell under a read mode. For example, a detection result of a programmed anti-fuse memory cell is "1", and a detection result of an unprogrammed anti-fuse memory cell is "0".

The logic control circuit is configured to coordinate and control various operations, for example, controlling the switching between different modes, controlling addressing of the anti-fuse memory cell, controlling reading of a fuse state of the anti-fuse memory cell, and controlling the enable of a high voltage circuit.

In an embodiment, the level shift circuit includes a first level shift circuit 21 and a second level shift circuit 22. The first level shift circuit 21 is coupled to the pre-decoding circuit 10, and is configured to boost the programming address pre-decoded signal and output a first boosted signal. The second level shift circuit 22 is coupled to the first level shift circuit 21, and is configured to boost the first boosted signal and output a second boosted signal.

In embodiments of the disclosure, after pre-decoding, multiple WL address signals and multiple programming row address signals can be obtained only by performing level shift for twice, so that the number of level shift circuits can be reduced, thereby decreasing the area of a chip.

In an embodiment, a voltage level of the first boosted signal includes a logic low value and a logic high value, and a voltage level of the second boosted signal includes a logic low value and a logic high value. The logic low value of the first boosted signal is less than the logic low value of the second boosted signal, and the logic high value of the first boosted signal is less than the logic high value of the second boosted signal.

In an embodiment, a voltage level of the programming address pre-decoded signal includes a logic low value and a logic high value. The logic low value and the logic high value of the voltage level of the programming address pre-decoded signal are 0V and 1.2V respectively. The logic low value and the logic high value of the voltage level of the first boosted signal are 0V and 3V respectively. The logic low value of the voltage level of the second boosted signal ranges from 2.5V to 3V, and the logic high value of the voltage level of the second boosted signal ranges from 5V to 6V.

That the first level shift circuit 21 is coupled to the pre-decoding circuit 10, and is configured to boost the programming address pre-decoded signal and output the first boosted signal includes: shifting the logic high value of the voltage level of the programming address pre-decoded signal to the logic high value of the voltage level of the first boosted signal. Specifically, the logic high value of the voltage level of the programming address pre-decoded signal is boosted from 1.2V to 3V, so as to form the logic high value of the voltage level of the first boosted signal; and the logic low value of the voltage level of the first boosted signal is kept the same as the logic low value of the voltage level of the programming address pre-decoded signal, and is still 0V.

That the second level shift circuit 22 is coupled to the first level shift circuit 21, and is configured to boost the first boosted signal and output the second boosted signal includes: shifting the logic low value of the voltage level of the first boosted signal to the logic low value of the voltage level of the second boosted signal, and shifting the logic high value of the voltage level of the first boosted signal to the logic high value of the voltage level of the second boosted signal. Specifically, the logic low value of the voltage level of the first boosted signal is boosted from 0V to a range from 2.5V to 3V, so as to form the logic low value of the voltage level of the second boosted signal; and the logic high value of the voltage level of the first boosted signal is boosted from 3V to a range from 5V to 6V, so as to form the logic high value of the voltage level of the second boosted signal.

In an embodiment, in the anti-fuse address decoding circuit, the programming address decoding circuit includes: a word line (WL) address decoding circuit 40 and a programming row address decoding circuit 30. The WL address decoding circuit 4 is coupled to the first level shift circuit 21, and is configured to output a WL address signal according to the first boosted signal. The programming row address decoding circuit 30 is coupled to the second level shift circuit 22, and is configured to output a programming row address signal according to the second boosted signal.

In some embodiments, the programming address includes row address information and sub-array address information.

The first boosted signal includes a first row address boosted signal and a first sub-array address boosted signal. The second boosted signal includes a second row address boosted signal and a second sub-array address boosted signal.

Figure 3A:
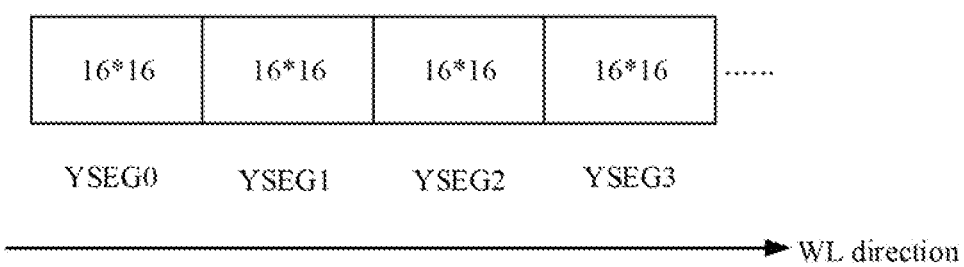
FIG. 3a and FIG. 3b illustrate schematic structural diagrams of a sub-array of an anti-fuse memory array according to embodiments of the disclosure.
Figure 3B:
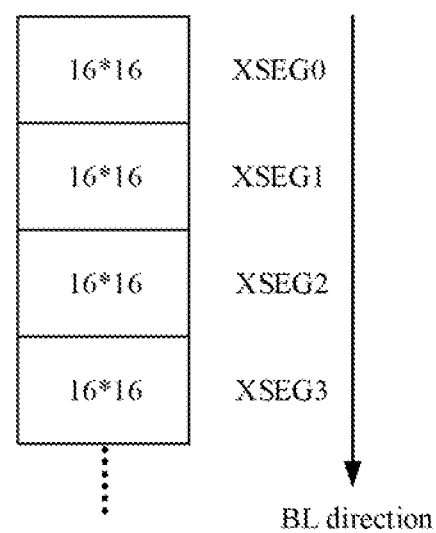

Specifically, FIG. 3a and FIG. 3b illustrate schematic structural diagrams of a sub-array of an anti-fuse memory array according to embodiments of the disclosure.

In some embodiments, in addition to a row address (XADD) and a column address (YADD), the address information of the anti-fuse memory array may further include a sub-array address, for example, YSEG, XSEG and ZADD. As illustrated in FIG. 3a, YSEG information is used to distinguish different sub arrays that share the same Word Line (WL). As shown in FIG. 3b, XSEG information is used to distinguish different sub-arrays that share the same Bit Line (BL). The anti-fuse memory array may be divided into different portions according to requirements. For example, cell sizes of different portions are different, and in this case, ZADD may be used to distinguish the different portions.

Figure 3C:
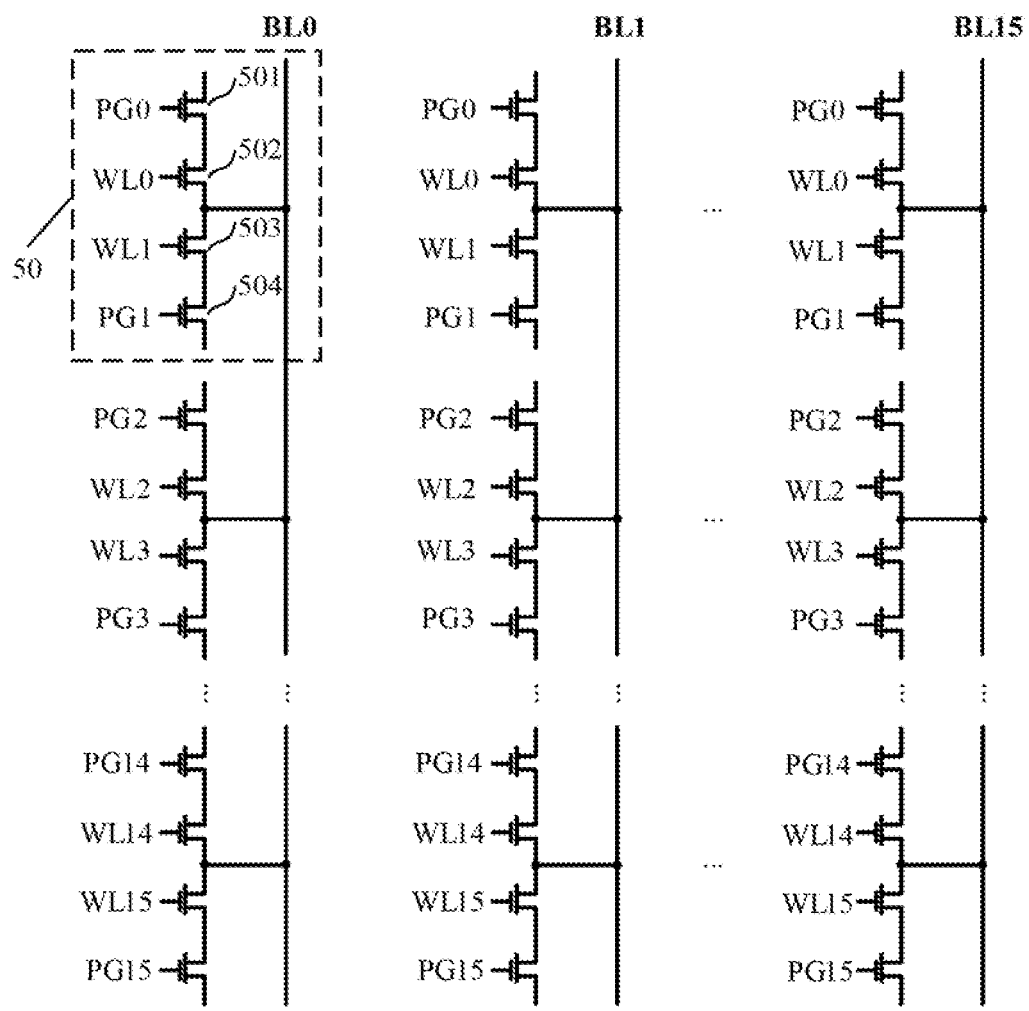
FIG. 3c illustrates a circuit diagram of a sub-array.

FIG. 3c illustrates a circuit diagram of a sub-array. As illustrated in FIG. 3c, with XSEG0 as an example, the sub-array includes multiple anti-fuse memory cells 50. Each anti-fuse memory cell 50 includes a first anti-fuse storage transistor 501, a first transistor 502, a second transistor 503 and a second anti-fuse storage transistor 504. The first transistor 502 and the second transistor 503 are controlled by means of two adjacent word lines WLm (m being a serial number of the corresponding WLs) respectively. The first anti-fuse storage transistor 501 and the second anti-fuse storage transistor 504 are controlled by means of two programming leads PGm (m being the serial number of the corresponding WLs) respectively. A first pole of the first anti-fuse storage transistor 501 is connected to a first pole of the first transistor 502. A first pole of the second anti-fuse storage transistor 504 is connected to a first pole of the second transistor 503. A second pole of the first transistor 502 is connected to a second pole of the second transistor 503, and the second pole of the first transistor 502 and the second pole of the second transistor 503 are connected to the BL.

Specifically, in combination with FIG. 3c, the sub-array is a 16*16 anti-fuse memory array. That is to say, the anti-fuse memory array includes 16 BLs and 16 WLs. Therefore, in the embodiment as illustrated in FIG. 3c, each BL is totally connected to 8 anti-fuse memory cells 50.

It is to be noted that, the row address information is decoded and outputted as the programming address pre-decoded signal. The programming address pre-decoded signal is boosted for the first time, so as to become a first row address boosted signal; and then, the first row address boosted signal is boosted for the second time, so as to become a second row address boosted signal. The sub-array address information is decoded and outputted as a programming sub-array address pre-decoding signal. The programming sub-array address pre-decoding signal is boosted for the first time, so as to become a first sub-array address boosted signal; and then the first sub-array address boosted signal is boosted for the second time, so as to become a second sub-array address boosted signal.

Figure 4A:
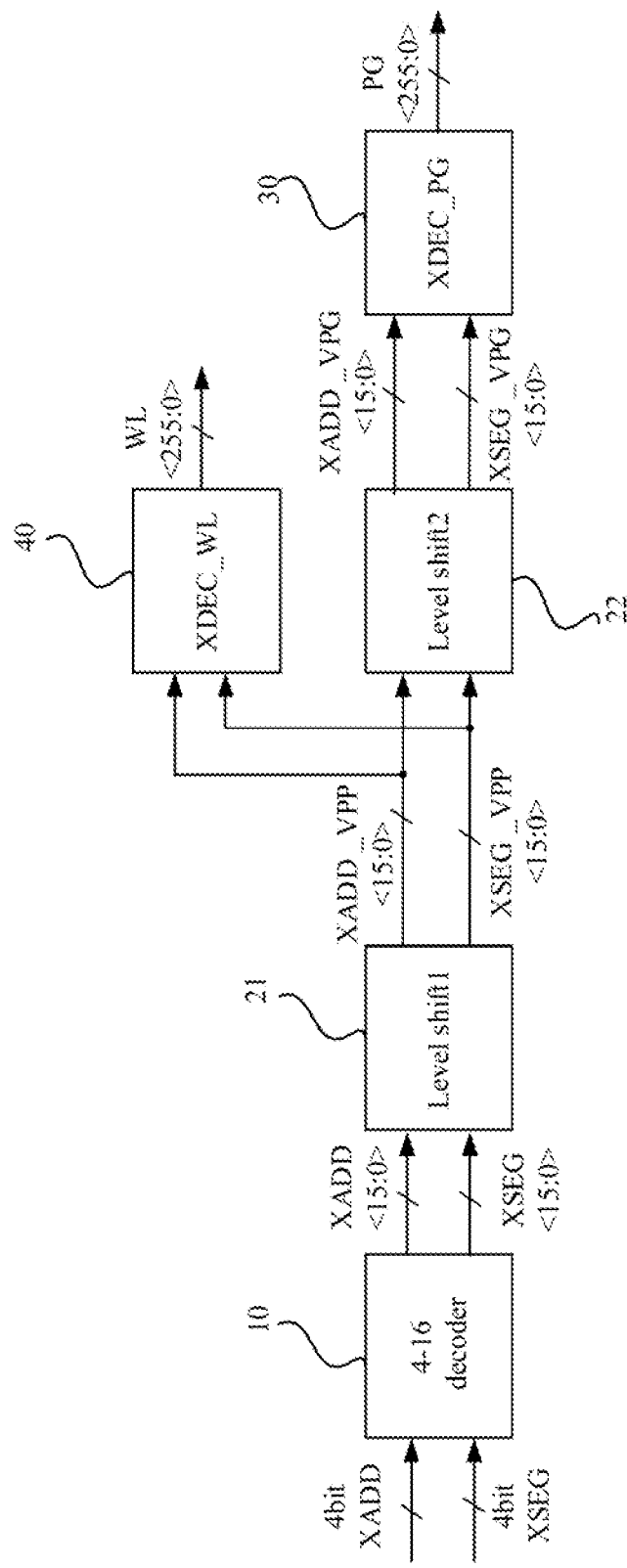
FIG. 4a illustrates a circuit diagram of an anti-fuse address decoding circuit according to embodiments of the disclosure.

FIG. 4a illustrates a circuit diagram of an anti-fuse address decoding circuit according to embodiments of the disclosure. As illustrated in FIG. 4a, the pre-decoding circuit 10 pre-decodes 4-bit row address information (4-bit XADD) and 4-bit sub-array address information (4-bit XSEG). The pre-decoding circuit 10 is a 4-to-16 decoder. After pre-decoding, 16-bit programming address pre-decoded signals are obtained, which respectively are a programming address pre-decoded signal (XADD<15:0>) and a programming sub-array address pre-decoding signal (XSEG<15:0>). The first level shift circuit 21 (Level shift1) boosts the programming address pre-decoded signal to obtain the first boosted signals, which are the first row address boosted signal (XADD_VPP<15:0>) and the first sub-array address boosted signal (XSEG_VPP<15:0>) respectively. Next, the WL address decoding circuit 40 (XDEC_WL) may output the WL address signal (WL<255:0>) according to the first row address boosted signal and the first sub-array address boosted signal. The second level shift circuit 22 (Level shift2) may boost the first row address boosted signal and the first sub-array address boosted signal, so as to respectively obtain the second row address boosted signal (XADD_VPG<15:0>) and the second sub-array address boosted signal (XSEG_VPPG<15:0>). The programming row address decoding circuit 30 (XDEC_PG) may output the programming row address signal (PG<255:0>) according to the second row address boosted signal and the second sub-array address boosted signal.

Figure 5A:
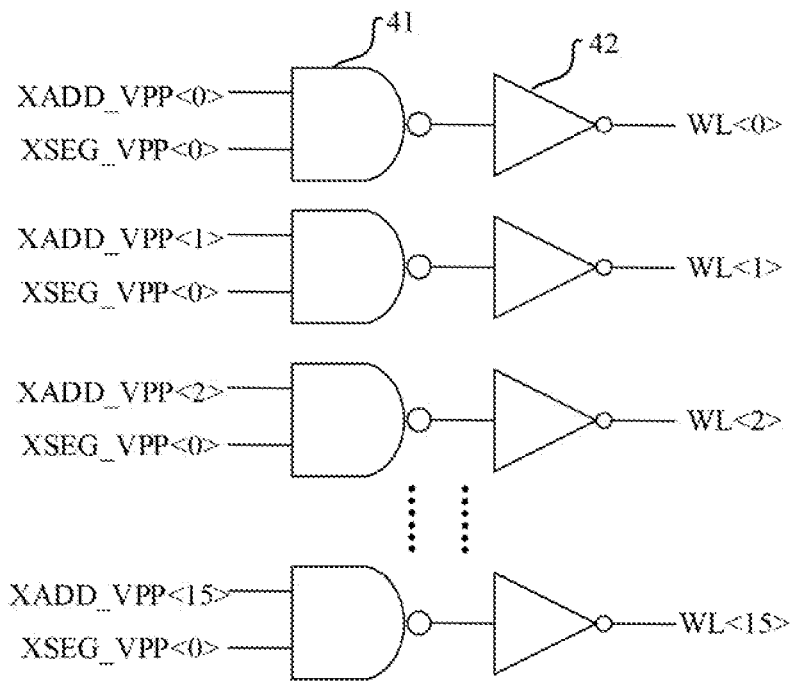
FIG. 5a and FIG. 5b illustrate circuit diagrams of a word line address decoding circuit according to embodiments of the disclosure.
Figure 5B:
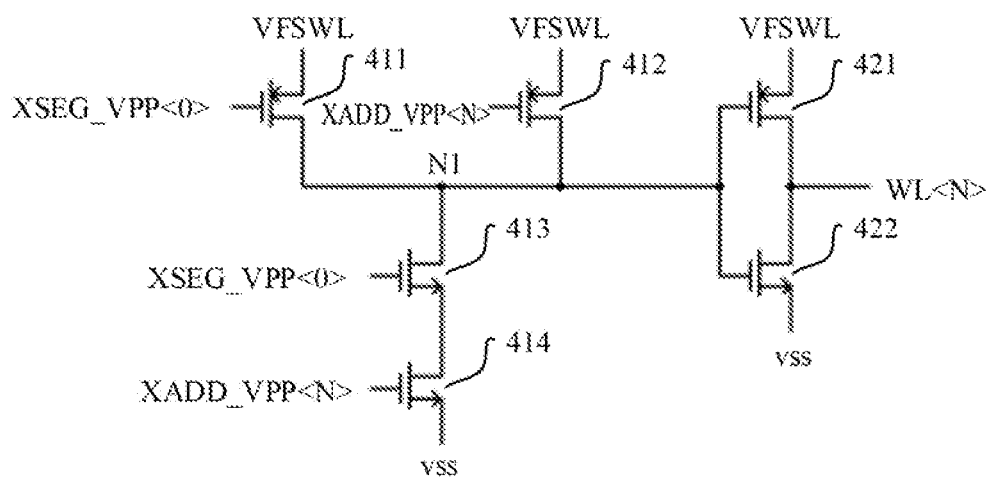

FIG. 5a and FIG. 5b illustrate circuit diagrams of a word line address decoding circuit according to embodiments of the disclosure. As illustrated in FIG. 5a, the WL address decoding circuit 40 includes a first NAND gate 41 and a first phase inverter 42. An input end of the first NAND gate 41 is connected to the first row address boosted signal and the first sub-array address boosted signal, and an output end of the first NAND gate 41 is connected to the first phase inverter 42. An output end of the first phase inverter 42 outputs the WL address signal. Specifically, for example, as illustrated in FIG. 5a, a 16-bit WL address signal (WL<15:0>) may be obtained according to the 16-bit first row address boosted signal (XADD_VPP<15:0>) and the 1-bit first sub-array address boosted signal (XSEG_VPP<0>).

As illustrated in FIG. 5b, the first NAND gate 41 includes a first P-type transistor 411, a second P-type transistor 412, a first N-type transistor 413 and a second N-type transistor 414. The first phase inverter 42 includes a third P-type transistor 421 and a third N-type transistor 422.

Control ends of the first P-type transistor 411 and the first N-type transistor 413 are controlled by the first sub-array address boosted signal (XSEG_VPP<n>). Control ends of the second P-type transistor 412 and the second N-type transistor 414 are controlled by means of the first row address boosted signal (XADD_VPP<N>).

First poles of the first P-type transistor 411, the second P-type transistor 412 and the first N-type transistor 413 are connected at a first node N1. Control ends of the third P-type transistor 421 and the third N-type transistor 422 intersect with each other and are connected at the first node N1. First poles of the third P-type transistor 421 and the third N-type transistor 422 are connected to each other and output the WL address signal (WL<N>).

Second poles of the second N-type transistor 414 and the third N-type transistor 422 are connected to a first voltage signal VSS. Second poles of the first P-type transistor 411, the second P-type transistor 412 and the third P-type transistor 421 are connected to a second voltage signal VFSWL. The first voltage signal VSS is less than the second voltage signal VFSWL.

Figure 4B:
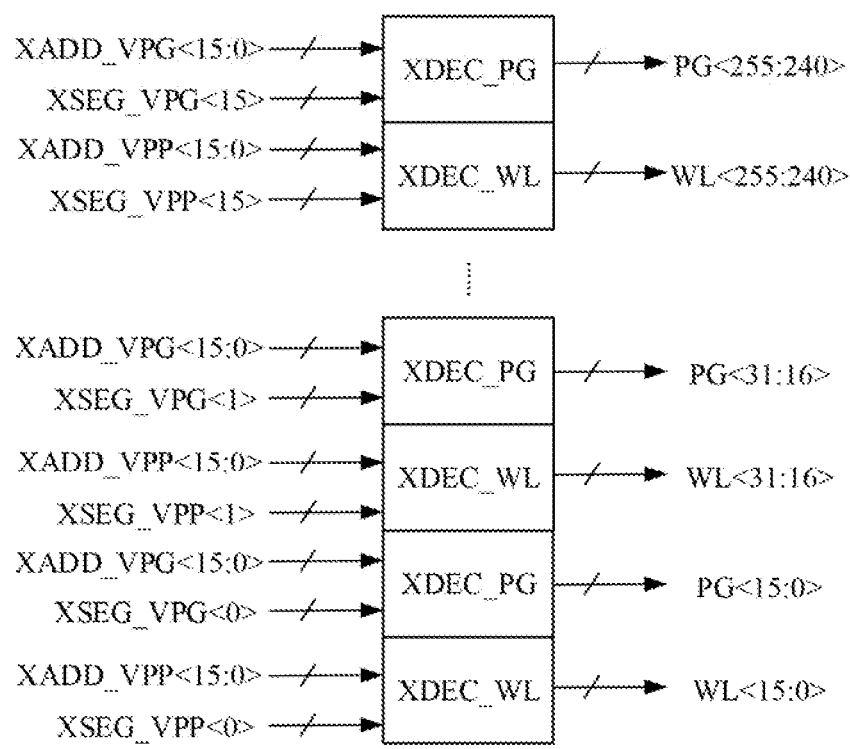
FIG. 4b illustrates a schematic structural diagram of a programming address decoding circuit according to embodiments of the disclosure.

Referring to FIG. 4b, the WL address decoding circuit XDEC_WL may perform decoding to obtain a 256-bit WL address signal (WL<256:0>) according to the 16-bit first row address boosted signal (XADD_VPP<15:0>) and the 16-bit first sub-array address boosted signal (XSEG_VPP<15:0>). Specifically, with one of the first sub-array address boosted signals as an example, a 16-bit WL address signal (WL<15:0>) may be obtained according to the 16-bit first row address boosted signal (XADD_VPP<15:0>) and a 1-bit first sub-array address boosted signal (XSEG_VPP<0>).

In an embodiment, a voltage value of the first voltage signal VSS is 0V, and a voltage value of the second voltage signal VFSWL is 2.5V.

Figure 6A:
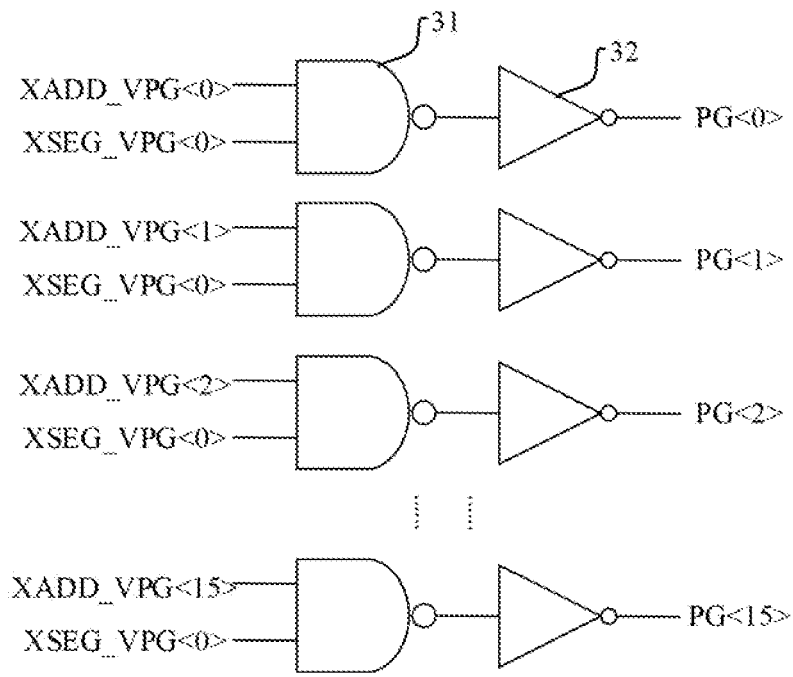
FIG. 6a and FIG. 6b illustrate circuit diagrams of a programming row address decoding circuit according to embodiments of the disclosure.
Figure 6B:
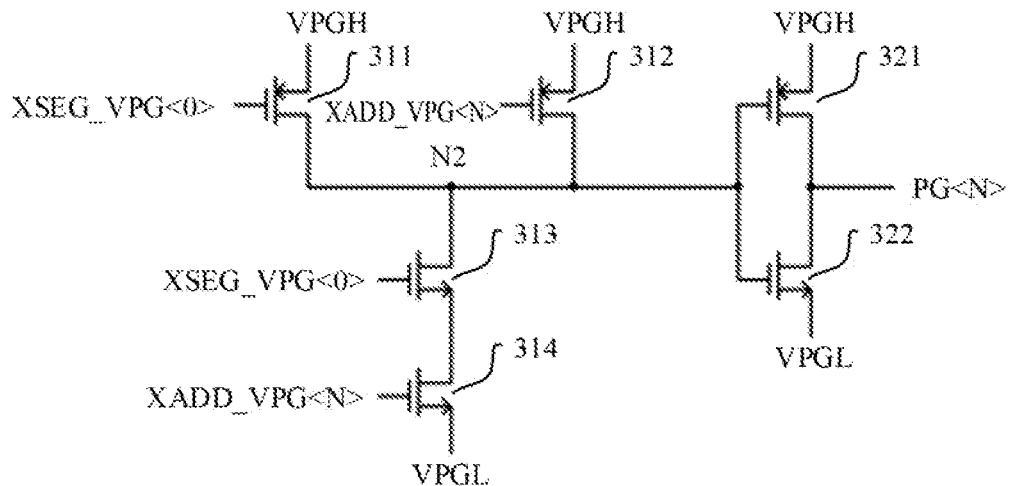

FIG. 6a and FIG. 6b illustrate circuit diagrams of a programming row address decoding circuit according to embodiments of the disclosure. As illustrated in FIG. 6a, the programming row address decoding circuit 30 includes a second NAND gate 31 and a second phase inverter 32. An input end of the second NAND gate 31 is connected to the second row address boosted signal and the second sub-array address boosted signal, and an output end of the second NAND gate 31 is connected to the second phase inverter 32. An output end of the second phase inverter 32 outputs the programming row address signal. Specifically, for example, as illustrated in FIG. 6a, a 16-bit programming row address signal (PG<15:0>) may be obtained according to a 16-bit second row address boosted signal (XADD_VPG<15:0>) and a 1-bit second sub-array address boosted signal (XSEG_VPG<0>).

As illustrated in FIG. 6b, the second NAND gate 31 includes a fourth P-type transistor 311, a fifth P-type transistor 312, a fourth N-type transistor 313 and a fifth N-type transistor 314. The second phase inverter 32 includes a sixth P-type transistor 321 and a sixth N-type transistor 322.

Control ends of the fourth P-type transistor 311 and the fourth N-type transistor 313 are controlled by the second sub-array address boosted signal (XSEG_VPG<n>). Control ends of the fifth P-type transistor 312 and the fifth N-type transistor 314 are controlled by the second row address boosted signal XADD_VPG<N>.

First poles of the fourth P-type transistor 311, the fifth P-type transistor 312 and the fourth N-type transistor 313 are connected at a second node N2. Control ends of the sixth P-type transistor 321 and the sixth N-type transistor 322 intersect with each other and are connected at the second node N2. First poles of the sixth P-type transistor 321 and the sixth N-type transistor 322 are connected to each other and output the programming row address signal (PG<N>).

Second poles of the fifth N-type transistor 314 and the sixth N-type transistor 322 are connected to a third voltage signal VPGL. Second poles of the fourth P-type transistor 311, the fifth P-type transistor 312 and the sixth P-type transistor 321 are connected to a fourth voltage signal VPGH. The third voltage signal VPGL is less than the fourth voltage signal VPGH.

Referring to FIG. 4b, the programming row address decoding circuit XDEC_PG may perform decoding to obtain a 256-bit programming row address signal (PG<256:0>) according to a 16-bit second row address boosted signal (XADD_VPG<15:0>) and a 16-bit second sub-array address boosted signal (XSEG_VPG<15:0>). Specifically, with one of the second sub-array address boosted signals as an example, a 16-bit programming row address signal (PG<15:0>) may be obtained according to a 16-bit second row address boosted signal (XADD_VPG<15:0>) and a 1-bit second sub-array address boosted signal (XSEG_VPG<0>).

In some embodiments, a voltage value of the third voltage signal VPGL ranges from 2.5V to 3V; and a voltage value of the fourth voltage signal VPGH ranges from 5V to 6V.

Figure 7:
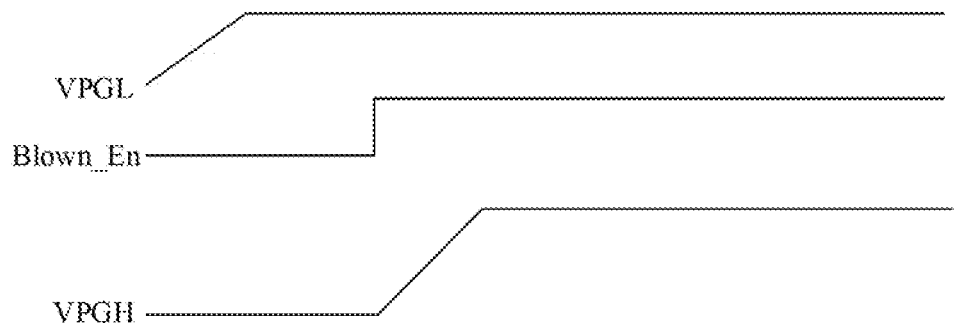
FIG. 7 illustrates a sequence diagram of an anti-fuse address decoding circuit according to embodiments of the disclosure.

The voltage of the fourth voltage signal VPGH ranges from 5V to 6V, and the voltage of the third voltage signal VPGL ranges from 2.5V to 3.0V. In order to prevent the device from being damaged by the high voltage of the VPGH, the VPGH needs to be powered up after the voltage of VPGL is stable. As shown in FIG. 7, after the VPGL is stable, and a programming enable (Blown_En) signal is valid, the VPGH is powered up, so that the device of the XDEC_PG circuit can be prevented from being damaged by the high voltage.

As the withstand voltage of a device is in terms of a relative voltage, if the difference between a high voltage and a low voltage of a circuit does not exceed a safe value, the device would not be not broken down. In embodiments of the disclosure, if the third voltage signal VPGL is posterior to the fourth voltage signal VPGH, the third voltage signal VPGL is enabled later than the 6.0V VPGH in this case and the maximum voltage difference of the circuit reaches 6.0V, resulting in breakdown and failure of the circuit. If the VPGL is started first and the VPGH is then started later, even if the voltage of the VPGH is very high, the voltage difference relative to the VPGL is only 3.0V; in such a case, the device would not be broken down and fail.

Figure 8:
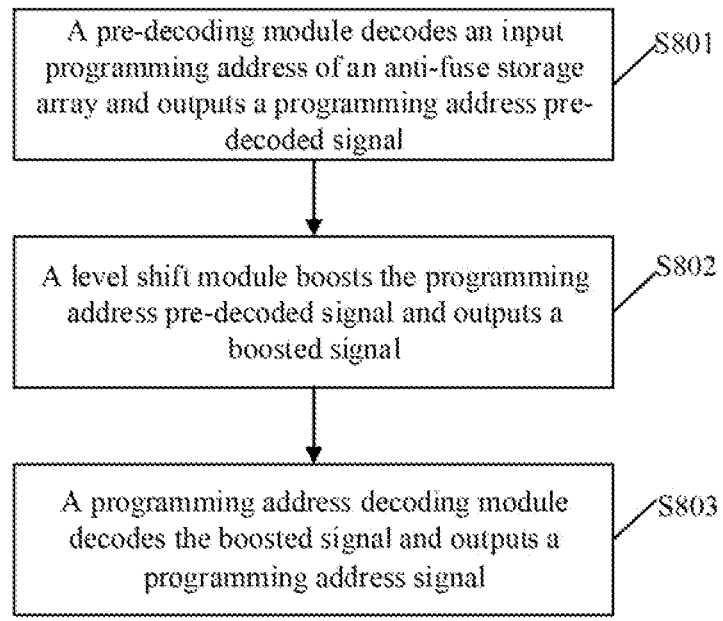
FIG. 8 illustrates a flowchart of an operation method for an anti-fuse address decoding circuit according to embodiments of the disclosure.

Embodiments of the disclosure further provide an operation method for an anti-fuse address decoding circuit. Please refer to FIG. 8 for details. As illustrated in the figure, the method includes the following operations.

At S801, a pre-decoding circuit decodes an input programming address of an anti-fuse memory array and outputs a programming address pre-decoded signal.

At S802, a level shift circuit boosts the programming address pre-decoded signal and outputs a boosted signal.

At S803, a programming address decoding circuit decodes the boosted signal and outputs a programming address signal.

The operation method for the anti-fuse address decoding circuit provided in the embodiments of the disclosure is further described in detail below with reference to specific embodiments.

Referring to FIG. 1, firstly, S801 is executed. The pre-decoding circuit 10 decodes the input programming address of the anti-fuse memory array and outputs the programming address pre-decoded signal.

Next, S802 is executed. The level shift circuit boosts the programming address pre-decoded signal and outputs the boosted signal.

In an embodiment, the operation that the level shift circuit boosts the programming address pre-decoded signal and outputs the boosted signal includes following operations: a first level shift circuit 21 boosts the programming address pre-decoded signal and outputs a first boosted signal; and a second level shift circuit 22 boosts the first boosted signal and outputs a second boosted signal.

In embodiments of the disclosure, after pre-decoding, multiple WL address signals and multiple programming row address signals can be obtained only by performing level shift for twice, so that the number of level shift circuits can be reduced, thereby decreasing the area of a chip.

In an embodiment, a voltage level of the first boosted signal includes a logic low value and a logic high value; and a voltage level of the second boosted signal includes a logic low value and a logic high value. The logic low value of the first boosted signal is less than the logic low value of the second boosted signal, and the logic high value of the first boosted signal is less than the logic high value of the second boosted signal.

In an embodiment, a voltage level of the programming address pre-decoded signal includes a logic low value and a logic high value. The logic low value and the logic high value of the voltage level of the programming address pre-decoded signal are 0V and 1.2V respectively. The logic low value and the logic high value of the voltage level of the first boosted signal are 0V and 3V respectively. The logic low value of the voltage level of the second boosted signal ranges from 2.5V to 3V, and the logic high value of the voltage level of the second boosted signal ranges from 5V to 6V.

The operation that the first level shift circuit 21 boosts the programming address pre-decoded signal and outputs the first boosted signal includes that the logic high value of the voltage level of the programming address pre-decoded signal is shifted to the logic high value of the voltage level of the first boosted signal. Specifically, the logic high value of the voltage level of the programming address pre-decoded signal is boosted from 1.2V to 3V, so as to form the logic high value of the voltage level of the first boosted signal; and the logic low value of the voltage level of the first boosted signal remains the same as the logic low value of the voltage level of the programming address pre-decoded signal, and is still 0V.

The operation that the second level shift circuit 22 boosts the first boosted signal and outputs the second boosted signal includes that: the logic low value of the voltage level of the first boosted signal is shifted to the logic low value of the voltage level of the second boosted signal, and the logic high value of the voltage level of the first boosted signal is shifted to the logic high value of the voltage level of the second boosted signal. Specifically, the logic low value of the voltage level of the first boosted signal is boosted from 0V to a range from 2.5V to 3V, so as to form the logic low value of the voltage level of the second boosted signal; and the logic high value of the voltage level of the first boosted signal is boosted from 3V to a range from 5V to 6V, so as to form the logic high value of the voltage level of the second boosted signal.

Next, S803 is executed. The programming address decoding circuit decodes the boosted signal and outputs the programming address signal.

In an embodiment, a WL address decoding circuit 40 in the programming address decoding circuit outputs a WL address signal according to the input first boosted signal.

A programming row address decoding circuit 30 in the programming address decoding circuit outputs a programming row address signal according to the input second boosted signal.

In an embodiment, a specific operation process of the operation method for the anti-fuse address decoding circuit is as illustrated in FIG. 4*a*. The pre-decoding circuit 10 pre-decodes 4-bit row address information (4 bit XADD) and 4-bit sub-array address information (4 bit XSEG). The pre-decoding circuit 10 is a 4-to-16 decoder. After pre-decoding, 16-bit programming address pre-decoded signals are obtained, which respectively are the programming address pre-decoded signal (XADD<15:0>) and the programming sub-array address pre-decoding signal (XSEG<15:0>). The first level shift circuit 21 (Level shift1) boosts the programming address pre-decoded signal to obtain the first boosted signals, which are respectively the first row address boosted signal (XADD_VPP<15:0>) and the first sub-array address boosted signal (XSEG_VPP<15:0>). Next, the WL address decoding circuit 40 (XDEC_WL) may output the WL address signal (WL<255:0>) according to the first row address boosted signal and the first sub-array address boosted signal. The second level shift circuit 22 (Level shift2) may boost the first row address boosted signal and the first sub-array address boosted signal, so as to obtain the second row address boosted signal (XADD_VPG<15:0>) and the second sub-array address boosted signal (XSEG_VPPG<15:0>) respectively. The programming row address decoding circuit 30 (XDEC_PG) may output the programming row address signal (PG<255:0>) according to the second row address boosted signal and the second sub-array address boosted signal.

Embodiments of the disclosure further provide a memory. The memory includes the anti-fuse address decoding circuit described in any one of the above embodiments.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

In the embodiments of the disclosure, by means of firstly pre-decoding the anti-fuse address decoding circuit, then performing boosting by the level shift circuit and then performing decoding to obtain an address signal, the number of level shift circuits can be reduced, so that an area of a chip can be decreased, and cost can be reduced.

The invention claimed is:

1. An anti-fuse address decoding circuit, comprising:
a pre-decoding circuit, configured to decode a programming address of an anti-fuse memory array and output a programming address pre-decoded signal;
a level shift circuit, coupled to the pre-decoding circuit, and configured to boost the programming address pre-decoded signal and output a boosted signal; and
a programming address decoding circuit, configured to receive the boosted signal, decode the boosted signal and output a programming address signal; wherein:
the level shift circuit comprises a first level shift circuit and a second level shift circuit;
the first level shift circuit is coupled to the pre-decoding circuit, and is configured to boost the programming address pre-decoded signal and output a first boosted signal; and
the second level shift circuit is coupled to the first level shift circuit, and is configured to boost the first boosted signal and output a second boosted signal.

2. The circuit of claim 1, wherein:
a voltage level of the first boosted signal comprises a logic low value and a logic high value, and a voltage level of the second boosted signal comprises a logic low value and a logic high value; and
the logic low value of the first boosted signal is less than the logic low value of the second boosted signal, and the logic high value of the first boosted signal is less than the logic high value of the second boosted signal.

3. The circuit of claim 2, wherein:
a voltage level of the programming address pre-decoded signal comprises a logic low value and a logic high value;
the logic low value and the logic high value of the voltage level of the programming address pre-decoded signal are 0V and 1.2V respectively;
the logic low value and the logic high value of the voltage level of the first boosted signal are 0V and 3V respectively; and
the logic low value of the voltage level of the second boosted signal ranges from 2.5V to 3V, and the logic high value of the voltage level of the second boosted signal ranges from 5V to 6V.

4. The circuit of claim 1, wherein the programming address decoding circuit comprises:
a word line (WL) address decoding circuit, coupled to the first level shift circuit, and configured to output a WL address signal according to the first boosted signal; and
a programming row address decoding circuit, coupled to the second level shift circuit, and configured to output a programming row address signal according to the second boosted signal.

5. The circuit of claim 4, wherein:
the programming address comprises row address information and sub-array address information;
the first boosted signal comprises a first row address boosted signal and a first sub-array address boosted signal; and
the second boosted signal comprises a second row address boosted signal and a second sub-array address boosted signal.

6. The circuit of claim 5, wherein
the WL address decoding circuit comprises a first NAND gate and a first phase inverter;
an input end of the first NAND gate is connected to the first row address boosted signal and the first sub-array address boosted signal, and an output end of the first NAND gate is connected to the first phase inverter; and
an output end of the first phase inverter outputs a WL address signal.

7. The circuit of claim 5, wherein:
the programming row address decoding circuit comprises a second NAND gate and a second phase inverter;
an input end of the second NAND gate is connected to the second row address boosted signal and the second sub-array address boosted signal, and an output end of the second NAND gate is connected to the second phase inverter; and an output end of the second phase inverter outputs the programming row address signal.

8. The circuit of claim 6, wherein:
the first NAND gate comprises a first P-type transistor, a second P-type transistor, a first N-type transistor and a second N-type transistor; and the first phase inverter comprises a third P-type transistor and a third N-type transistor;
control ends of the first P-type transistor and the first N-type transistor are controlled by the first sub-array address boosted signal, and control ends of the second P-type transistor and the second N-type transistor are controlled by the first row address boosted signal;
first poles of the first P-type transistor, the second P-type transistor and the first N-type transistor are connected at a first node, control ends of the third P-type transistor and the third N-type transistor intersect with each other and are connected at the first node, and first poles of the third P-type transistor and the third N-type transistor are connected to each other and output the WL address signal; and
second poles of the second N-type transistor and the third N-type transistor are connected to a first voltage signal; and second poles of the first P-type transistor, the second P-type transistor and the third P-type transistor are connected to a second voltage signal, wherein the first voltage signal is less than the second voltage signal.

9. The circuit of claim 8, wherein:
a voltage value of the first voltage signal is 0V, and a voltage value of the second voltage signal is 2.5V.

10. The circuit of claim 7, wherein:
the second NAND gate comprises a fourth P-type transistor, a fifth P-type transistor, a fourth N-type transistor and a fifth N-type transistor; and the second phase inverter comprises a sixth P-type transistor and a sixth N-type transistor;
control ends of the fourth P-type transistor and the fourth N-type transistor are controlled by the second sub-array address boosted signal, and control ends of the fifth P-type transistor and the fifth N-type transistor are controlled by the second row address boosted signal;
first poles of the fourth P-type transistor, the fifth P-type transistor and the fourth N-type transistor are connected at a second node, control ends of the sixth P-type transistor and the sixth N-type transistor intersect with each other and are connected at the second node, and first poles of the sixth P-type transistor and the sixth N-type transistor are connected to each other and output the programming row address signal; and
second poles of the fifth N-type transistor and the sixth N-type transistor are connected to a third voltage signal; and second poles of the fourth P-type transistor, the fifth P-type transistor and the sixth P-type transistor are connected to a fourth voltage signal, wherein the third voltage signal is less than the fourth voltage signal.

11. The circuit of claim 10, wherein:
a voltage value of the third voltage signal ranges from 2.5V to 3V; and a voltage value of the fourth voltage signal ranges from 5V to 6V.

12. A memory, comprising an anti-fuse address decoding circuit, wherein the anti-fuse address decoding circuit comprises:
a pre-decoding circuit, configured to decode a programming address of an anti-fuse memory array and output a programming address pre-decoded signal;
a level shift circuit, coupled to the pre-decoding circuit, and configured to boost the programming address pre-decoded signal and output a boosted signal; and
a programming address decoding circuit, configured to receive the boosted signal, decode the boosted signal and output a programming address signal;
wherein:
the level shift circuit comprises a first level shift circuit and a second level shift circuit;
the first level shift circuit is coupled to the pre-decoding circuit, and is configured to boost the programming address pre-decoded signal and output a first boosted signal; and
the second level shift circuit is coupled to the first level shift circuit, and is configured to boost the first boosted signal and output a second boosted signal.

13. An operation method for an anti-fuse address decoding circuit, comprising:
decoding, by a pre-decoding circuit, an input programming address of an anti-fuse memory array, and outputting, by the pre-decoding circuit, a programming address pre-decoded signal;
boosting, by a level shift circuit, the programming address pre-decoded signal and outputting, by the level shift circuit, a boosted signal; and
decoding the boosted signal by a programming address decoding circuit and outputting a programming address signal by the programming address decoding circuit;
wherein:
boosting, by the level shift circuit, the programming address pre-decoded signal and outputting, by the level shift circuit, the boosted signal comprises:
boosting, by a first level shift circuit, the programming address pre-decoded signal and outputting, by first level shift circuit, a first boosted signal; and
boosting, by a second level shift circuit, the first boosted signal and outputting, by the second level shift circuit, a second boosted signal.

14. The method of claim 13, further comprising:
outputting a word line (WL) address signal according to the input first boosted signal by a WL address decoding circuit in the programming address decoding circuit; and
outputting a programming row address signal according to the input second boosted signal by a programming row address decoding circuit in the programming address decoding circuit.

15. The method of claim 13, wherein decoding the boosted signal by the programming address decoding circuit and outputting the programming address signal by the programming address decoding circuit comprises:
outputting a word line (WL) address signal according to the first boosted signal by a WL address decoding circuit in the programming address decoding circuit, wherein the WL address decoding circuit is coupled to the first level shift circuit; and
outputting a programming row address signal according to the second boosted signal by a programming row address decoding circuit in the programming address decoding circuit, wherein the programming row address decoding circuit is coupled to the second level shift circuit.

16. The method of claim 13, wherein boosting, by the first level shift circuit, the programming address pre-decoded signal comprises:
boosting, by the first level shift circuit, a logic high value of the programming address pre-decoded signal to a logic high value of the first boosted signal.

17. The method of claim 16, wherein boosting, by the first level shift circuit, the programming address pre-decoded signal further comprises:
- keeping a logic low value of the programming address pre-decoded signal unchanged, so as to obtain the first boosted signal.

18. The method of claim 17, wherein boosting, by the second level shift circuit, the first boosted signal comprises:
- boosting, by the second level shift circuit, the logic high value of the first boosted signal to a logic high value of the second boosted signal; and
- boosting, by the second level shift circuit a logic low value of the first boosted signal to a logic low value of the second boosted signal, so as to obtain the second boosted signal.

* * * * *